(12) United States Patent
Subramanian et al.

(10) Patent No.: US 6,933,060 B2
(45) Date of Patent: Aug. 23, 2005

(54) THERMAL BARRIER COATING RESISTANT TO SINTERING

(75) Inventors: Ramesh Subramanian, Oviedo, FL (US); Brig B. Seth, Maitland, FL (US)

(73) Assignee: Siemens Westinghouse Power Corporation, Orlando, FL (US)

( * ) Notice: Subject to any disclaimer, the term of this patent is extended or adjusted under 35 U.S.C. 154(b) by 69 days.

(21) Appl. No.: 10/158,305

(22) Filed: May 30, 2002

(65) Prior Publication Data

US 2005/0064213 A1 Mar. 24, 2005

Related U.S. Application Data

(63) Continuation-in-part of application No. 09/640,073, filed on Aug. 17, 2000, now Pat. No. 6,756,082, which is a continuation-in-part of application No. 09/393,415, filed on Sep. 10, 1999, now Pat. No. 6,296,945, which is a continuation-in-part of application No. 09/245,262, filed on Feb. 5, 1999, now Pat. No. 6,203,927.

(51) Int. Cl.[7] .............................. B32B 15/04; F03B 3/12
(52) U.S. Cl. ....................... 428/632; 428/633; 428/332; 428/155; 428/701; 428/702; 428/697; 416/241 B
(58) Field of Search ................................ 428/469, 472, 428/472.2, 623, 633, 632, 650, 701, 702, 697, 699, 698, 323, 328, 329, 332, 155, 136, 134; 416/241 B (56) References Cited

U.S. PATENT DOCUMENTS

| | | | |
|---|---|---|---|
| 4,321,310 A | 3/1982 | Ulion et al. | |
| 4,457,948 A | 7/1984 | Ruckle et al. | |
| 4,837,187 A | 6/1989 | Frank et al. | |
| 5,073,433 A | 12/1991 | Taylor | |
| 5,520,516 A | * 5/1996 | Taylor et al. | |
| 5,562,998 A | 10/1996 | Strangman | |
| 5,683,825 A | 11/1997 | Bruce et al. | |
| 5,743,013 A | 4/1998 | Taylor et al. | |
| 5,830,586 A | 11/1998 | Gray et al. | |
| 6,103,386 A | 8/2000 | Raybould et al. | |
| 6,296,945 B1 | * 10/2001 | Subramanian | |

FOREIGN PATENT DOCUMENTS

EP 0 705 912 A2 4/1996

OTHER PUBLICATIONS

Johner, G. et al., "Experimental and Theoretical Aspects of Thick Thermal Barrier Coatings for Turbine Applications", Thermal Spray: Advances in Coatings Technology, Proceedings of the National Thermal Spray Conference, Sep. 1987, pp. 155–166.

Nerz, J.E. et al., "Taguchi Analysis of Thick Thermal Barrier Coatings", Thermal Spray and Research Applications, Proceedings of the 3rd National Thermal Spray Conference, May 1990, pp. 669–673.

(Continued)

Primary Examiner—Jennifer McNeil (57) ABSTRACT

A device (10) is made, having a ceramic thermal barrier coating layer (16) characterized by a microstructure having gaps (18) with a sintering inhibiting material (22) disposed on the columns (20) within the gaps (18). The sintering resistant material (22) is stable over the range of operating temperatures of the device (10), is not soluble with the underlying ceramic layer (16) and is applied by a process that is not an electron beam physical vapor deposition process. The sintering inhibiting material (22) has a morphology adapted to improve the functionality of the sintering inhibiting material (22), characterized as continuous, nodule, rivulet, grain, crack, flake and combinations thereof and being disposed within at least some of the vertical and horizontal gaps.

20 Claims, 7 Drawing Sheets

OTHER PUBLICATIONS

Kimura, Y. et al., "On the Effects of Sealing Treatment and Micro–Structural Grading Upon Corrosion Characteristics of Plasma–Sprayed Ceramic Coating", Proceedings of the 7th National Thermal Spray Conference, Jun. 1994, pp. 527–532.

Moriya, K. et al., "Sealing of Plasma Sprayed Ceramic Coatings by Sol–Gel Process", Proceedings of the 7th National Thermal Spray Conference, Jun. 1994, pp. 549–553.

Haddadi, A. et al., "Crystalline Growth within Alumina and Zirconia Coatings with Coating Temperature Control During Spraying", Thermal Spray: Practical Solutions for Engineering Problems, 1996, pp. 615–622.

Kathikeyan, J. et al., "Ceramic Impregnation of Plasma Sprayed Thermal Barrier Coatings", Thermal Spray: Practical Solutions for Engineering Problems, 1996, pp. 477–482.

Lugscheider, E. et al., "Enhanced Atmospheric Plasma Spraying of Thick TBS by Improved Process Control and Deposition Efficiency", Proceedings of the 15th International Thermal Spray Conference, May 1998, pp. 1583–1588.

Wigren, J. et al., "A Combustor can with 1.8 MM Thick Plasma Sprayed Thermal Barrier Coating", International Gas Turbine & Aeroengine Congress & Exhibition, 1998, pp. 1–10.

Wigren, J. et al., "Thermal Barrier Coatings—Why, How, Where and Where to", Proceedings of the 15th International Thermal Spray Conference, May 1998, pp. 1531–1542.

* cited by examiner

THERMAL BARRIER COATING RESISTANT TO SINTERING

CROSS REFERENCE TO RELATED APPLICATIONS

This application is a continuation-in-part application of U.S. Ser. No. 09/640,073 filed Aug. 17, 2000, now U.S. Pat. No. 6,756,082 which is a continuation-in-part application of U.S. Ser. No. 09/393,415, filed Sep. 10, 1999, now U.S. Pat. No. 6,296,945 and a continuation-in-part application of U.S. Ser. No. 09/245,262, filed Feb. 5, 1999, now U.S. Pat. No. 6,203,927.

FIELD OF THE INVENTION

This invention relates generally to the field of thermal barrier coatings (TBC), and more particularly to a thermal barrier coating for very high temperature applications, such as combustion turbine engines. In particular, this invention relates to the field of multilayer ceramic thermal barrier coatings resistant to sintering damage used for coating superalloy components of a combustion turbine. These TBCs are applied by inexpensive processes selected from the group consisting of: ceramic processing techniques, such as sol-gel techniques; vapor deposition techniques, such as chemical vapor deposition; and, preferably, thermal spraying techniques, such as air plasma spraying (APS), where induced vertical gaps in the TBC surface microstructure are prevented from sintering in service, to ensure strain tolerance during use.

GOVERNMENT RIGHTS STATEMENT

This invention was conceived under United States Department of Energy Contract DE-FCO2-00CH11048. The United States Government has certain rights hereunder.

BACKGROUND OF THE INVENTION

The demand for continued improvement in the efficiency of combustion turbine and combined cycle power plants has driven the designers of these systems to specify increasingly higher turbine inlet temperatures. Although nickel and cobalt based superalloy materials are now used for components in the hot gas flow path, such as combustor transition pieces and turbine rotating and stationary blades, even these superalloy materials are not capable of surviving long term operation at temperatures sometimes exceeding 1000° C.

It is known in the art to coat a superalloy metal component with an insulating ceramic material to improve its ability to survive high operating temperatures; see, for example, U.S. Pat. No. 4,321,310 (Ulion et al). It is also known in the art to coat the insulating ceramic material with an erosion resistant material to reduce its susceptibility to wear caused by the impact of the particles carried within the hot gas flow path; see, for example, U.S. Pat. Nos. 5,683,825 (Bruce et al.) and U.S. Pat. No. 5,562,998 (Strangman). U.S. patent application Ser. No. 09/393,417, filed on Sep. 10, 1999 taught air plasma sprayed TBC coatings of 50 micrometer to 350 micrometer thickness, applied to superalloy base substrates, for turbine application. There, the TBC coating had a planar grained microstructure, where an overlay was allowed to infiltrate the TBC bulk, completely or partially fill microcrack volumes generally parallel to the superalloy base substrate, and finally react with the TBC material. This was to provide a sintering inhibitor, as well as a coating with a low thermal conductivity, which is also erosion and corrosion resistant.

Much of the development in this field of technology has been driven by the aircraft engine industry, where turbine engines are required to operate at high temperatures and are subjected to frequent temperature transients as the power level of the engine is varied. A combustion turbine engine installed in a land-based power generating plant is also subjected to high operating temperatures and temperature transients, but it may also be required to operate at full power and at its highest temperatures for very long periods of time, such as for days or even weeks at a time. Prior art insulating systems are susceptible to degradation under such conditions at the elevated temperatures demanded in the most modern combustion turbine systems.

In particular, with regard to air plasma sprayed (APS) TBC's, due to repeated thermal cycling, these coatings have to readily accommodate the thermal expansion mismatch stresses and thermal strains to remain adherent to the superalloy substrate. Typical APS coatings achieve this by porosity which is deliberately introduced during the deposition process, such as inter splat boundaries and micro-cracks within the ceramic splats. With increasing demands for higher efficiency of engines, the gas path temperatures are expected to rise and consequently the temperatures at the surface of the ceramic TBC. Higher temperatures would then lead to accelerated sintering of cracks and pores in the APS coatings, especially at the surface. Sintering results in densification of the coating and can lead to its early spallation, due to its reduced capacity to accommodate thermal cycling. Stresses due to thermal cycling can be relieved by vertical cracks through the coating, which increases the thermal cyclic life of the coating.

These vertical cracks in APS coatings can result during the air plasma spraying process, as described in the many articles published in the field of thermal barrier coatings, for example, "Thermal Spray: Advances in Coatings Technology—Experimental and Theoretical Aspects of Thick Thermal Barrier Coatings for Turbine Applications," G. J. Wilms et al., *Proceedings of the National Thermal Spray Conference*, Sep. 14–17, 1987, Ed. D. L. Houck pp. 155–166. There, APS spraying at high substrate temperatures was described as inducing vertical segmentation cracks which form while relieving shrinkage stresses within the deposited TBC upon cooling. Initiation of segmentation cracks during APS spraying at high substrate temperatures of the TBC is shown in FIGS. 12 and 13 of the Wilms et al. article, where a brick-like microstructure is shown, and also in FIGS. 3 and 4 where a more monolithic structure is shown, as in FIG. 6. Preferred thick TBC's, over about 2 mm, are described as being dense, less than 15% porosity, but where individual planar platelets are microwelded to each other and connected to their sublayers with a fine network of vertical segmentation cracks, rather than being porous, about 20% or greater porosity.

Coatings deposited by the APS process, with vertical cracks are called segmented TBCs. Formation of vertical cracks in APS coatings are also discussed in U.S. Pat. Nos. 4,457,948; 5,073,433; 5,743,013 and 5,839,586 (Ruckle et al., Taylor, Taylor et al. and Gray et al., respectively), in European Patent 0 705 912 A2, and also in "Crystalline Growth Within Alumina and Zirconia Coatings with Coating Temperature Control During Spraying," A. Haddadi et al., *Thermal Spray: Practical Solutions for Engineering Problems*, C. C. Brendt (Ed.), ASM International, Materials Park Ohio, 1996, pp. 615–622; "Taguchi Analysis of Thick Thermal Barrier Coatings," J. B. Nerz et al., *Thermal Spray Research and Applications, Proc. 3$^{rd}$ National Thermal Spray Conference*, Long Beach Calif., 1990, pp. 669–673;

and "Enhanced Atmospheric Plasma Spraying of Thick TBCs by Improved Process Control and Deposition Efficiency," E. Lugscheider et al., *Proc. 15th International Thermal Spray Conference,* 1998, pp. 1583–1588.

J. Wigren et al., in "A Combustor Can with 1.8 mm Thick Plasma Sprayed Thermal Barrier Coatings," *International Gas Turbine and Aeroengine Congress and Exhibition Proceeding,* American Society of Mechanical Engineers, 1998, pp. 1–10, taught a series of temperature cycles between 330° C. and 340° C. over time to induce branched segmentation cracks, for thick protective TBC coatings on combustor walls. Such branchings were also described by J. Wigren et al. in "Thermal Barrier Coatings—Why, How, Where and Where To," *Proceedings of the 15th International Thermal Spray Conference,* pp. 1531–1542, May 25–29, 1998, where it was pointed out that sophisticated TBC's have raised the temperature capability of gas turbines by about 500° C. in the last 15 years.

While these patents and articles discuss induced microcracks in ceramic coatings, other articles discuss filling such microcracks, primarily to act as seals to corrosive agents, for example, "Effects of Sealing Treatment and Microstructural Grading upon Corrosion Characteristics of Plasma Sprayed Ceramic Coating," Y. Kimura et al., *Proc. 7th National Thermal Spray Conference* 1994, pp. 527–536; "Sealing of Plasma Sprayed Ceramic Coatings by Sol-Gel Process," K. Moriya et al., *7th National Thermal Spray Conference* 1994, 549–553; and "Ceramic Impregnation of Plasma Sprayed Thermal Barrier Coatings," J. Karthikeyan et al., *Thermal Spray: Practical Solutions for Engineering Problems,* ASM International, 1996, pp. 477–482.

The above-mentioned patents articles, however, do not address the possibility of sintering the vertical cracks and the subsequent lose in strain compliance with increasing operating temperatures.

Accordingly, it is an object of this invention to make a device which is capable of operating at temperatures in excess of 1200° C. for extended periods of time, with reduced component degradation. It is also an object of this invention to provide a method of producing such a device that utilizes only commercially available material processing steps and inexpensive deposition techniques, such as APS, rather than electron beam physical vapor deposition ("EB-PVD"). The APS process basically involves spraying TBC powders, such as stabilized zirconia, after passing them through a plasma gun.

SUMMARY

These and other objects of the invention are achieved by providing a method for producing a device operable over a range of temperatures which comprises the steps: providing a substrate; optionally, coating a bond coat layer on the substrate; coating a ceramic layer at least 50 micrometers thick on the bond coat layer or the substrate by a process selected from the group consisting of ceramic processing techniques, vapor deposition techniques and thermal spray techniques, in a manner that provides said ceramic layer with a microstructure characterized by a plurality of vertical and horizontal gaps, where the vertical gaps provide a columnar structure extending from the outer surface to at least about ⅓ of the thickness toward the substrate; and depositing, at least, within the vertical gaps a sintering inhibiting material, where the majority of vertical and horizontal gaps are not closed. If a bond coat is not used, the ceramic layer can be applied directly to the substrate.

This invention has the potential to extend the operating temperature capabilities and durability of turbine engines beyond the current state of the art, air plasma spray (APS) 8 wt. % yttrium stabilized zirconia TBC. It involves the deposition of ceramic coatings with horizontal and predominantly-vertical gaps and the infiltration of these predominantly vertical cracks with a sintering inhibitor. Upon operation at high temperatures, where sintering or closing up of the cracks could occur leading to a loss in strain tolerance, the sintering inhibitor is expected to prevent closure of the vertical cracks. This will allow for maintenance of a strain tolerant TBC to higher surface temperatures and/or extended periods of operation and consequently lead to improved performance. This invention provides a cost-effective alternative to the EB-PVD process.

The EB-PVD process is a very expensive technique compared to air plasma spraying and this is primarily due to the requirement of a vacuum chamber to deposit the coatings and also the longer processing time required for the complete coverage of the turbine components. A cost-effective process is air plasma spraying and a microstructure with vertical cracks can be obtained by notifying the deposition parameters to yield segmented TBCs. Similar microstructures may also be processed by other coating techniques such as sol-gel and chemical vapor deposition "CVD" techniques. By introducing a sintering inhibitor, the multiphase coating system discussed in this disclosure becomes an economically very competitive thermal barrier coating system for application at high temperatures. Additionally, the selection process for the composition of the base ceramic coating need not be constrained by requirements specific to physical vapor deposition techniques, such as minimum differences in vapor pressure between the constituents of the ceramic composition. With the additional flexibility of utilizing plasma spraying techniques, more complex parts can be handled when compared to EB-PVD coatings.

In accordance with another aspect of the present invention, a device adapted for use in a high temperature environment in excess of about 1000° C. is provided. The device comprises a substrate having a surface; a ceramic layer disposed on the substrate surface in a manner that provides the ceramic layer with a microstructure characterized by a plurality of vertical and horizontal gaps; and a sintering inhibiting material having a morphology selected from the group consisting of rivulet, grain, crack, flake and combinations thereof disposed within at least some of the vertical and horizontal gaps.

In accordance with another aspect of the present invention, a thermal barrier coating adapted to at least partially coat a substrate for use in a high temperature environment in excess of about 1000° C. is provide. The thermal barrier coating comprises a ceramic layer disposed on a substrate surface in a manner that provides the ceramic layer with a microstructure characterized by a plurality of vertical and horizontal gaps; and a sintering inhibiting material having a morphology selected from the group consisting of rivulet, grain, crack, flake and combinations thereof disposed within at least some of the vertical and horizontal gaps.

In accordance with another aspect of the present invention, a combustion turbine blade adapted to withstand temperatures in excess of about 1000° C. for prolonged periods of time is provided. The blade comprises a superalloy substrate; a ceramic layer disposed on the substrate surface in a manner that provides the ceramic layer with a microstructure characterized by a plurality of vertical and horizontal gaps; and a sintering inhibiting material having a morphology selected from the group consisting of rivulet, grain, crack, flake and combinations thereof disposed within at least some of the vertical and horizontal gaps.

DESCRIPTION OF THE PREFERRED EMBODIMENTS

When prior art thermal barrier coating systems are exposed to the high temperature environment of the hot gas flow path of a land-based combustion turbine power plant, one of the reasons for failure of the thermal barrier coating is sintering of the ceramic TBC and consequent loss in strain tolerance. A current state-of the-art thermal barrier coating is yttria stabilized zirconia (YSZ). The YSZ may be applied in this invention by thermal spray processes such as new and improved air plasma spray APS, inductively coupled plasma processes, high power and high velocity plasma processes, or by vapor deposition processes such as chemical vapor deposition CVD, MOCVD, or by ceramic processing techniques such as sol-gel, all now well known in the art. These techniques can provide a predominantly vertical (in relation to the substrate) columnar microstructure at the outside surface of TBCs and also create a series of submicron sized horizontal cracks within the YSZ layer intersecting the columnar microstructure. For the purposes of this application, the terms "gap" is meant to include not only the gaps between adjacent columns in a columnar microstructure, but also horizontal cracks resulting from APS or similar processes. The amount of vertical and horizontal gaps in the TBC can be accurately controlled by modification of deposition parameters.

The gaps provide a mechanical flexibility to the ceramic TBC layer. During operation at high temperatures, it is known that these gaps have a tendency to close, and if the device is maintained at the elevated temperature for a sufficient length of time, the adjacent sides of the gaps will bond together by sintering. The bonding of the ceramic material across the gaps reduces the strain compliance of the ceramic coating, thereby contributing to failure of the coating during subsequent thermal transients.

Figure 1:
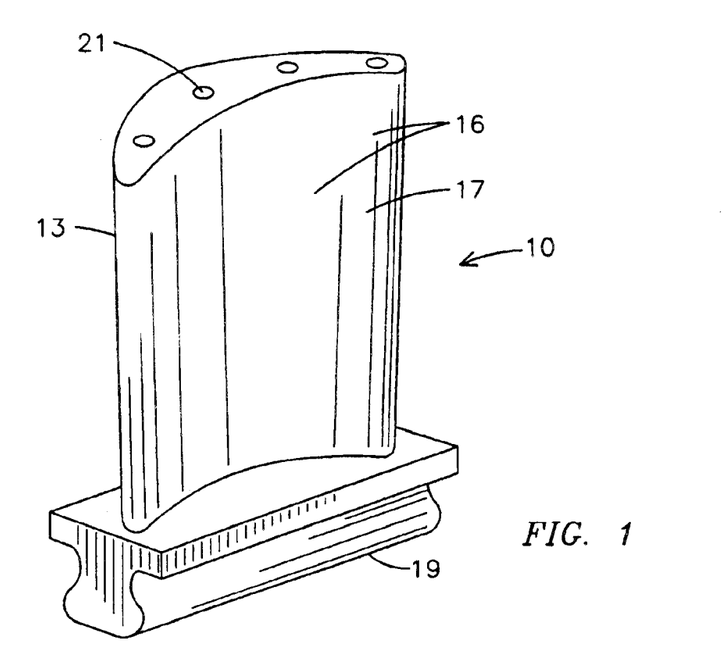
FIG. 1 is a perspective view of a device, such as a turbine blade coated with a ceramic thermal barrier layer.

Referring now to FIG. 1, one component device of a turbine is shown. Turbine blade 10 has a leading edge 13 and an airfoil section 17, against which hot combustion gases are directed during operation of the turbine, and which is subject to severe thermal stresses, oxidation and corrosion. The root end 19 of the blade anchors the blade. Cooling passages 21 may be present through the blade to allow cooling air to transfer heat from the blade. The blade itself 10 can be made from a high temperature resistant nickel or cobalt based superalloy 12, shown in FIG. 2, such as, a combination of Ni—Cr—Al—Co—Ta—Mo—W.

Figure 2:
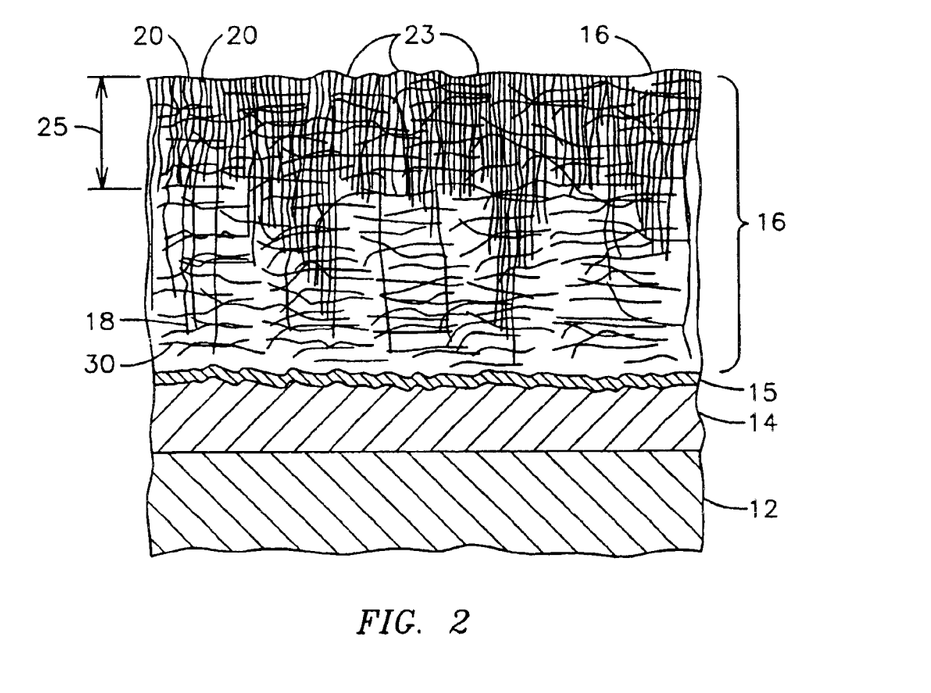
FIG. 2 is a cross-sectional view of a device having a thermal barrier coating in accordance with this invention, where a stable ceramic material is infiltrated onto the vertical and horizontal micro crack gaps.

A bond coat 14 could cover the body of the turbine blade 12, which could then be covered by the thermal barrier coating 16, all shown in FIG. 2. The barrier layer of this invention, as well as the bond coat (or base coat) and other protective coating can be used on a wide variety of other components of turbines, such as, turbine vanes, turbine transitions, or the like, which may be large and of complex geometry, or upon any substrate made of, for example metal or ceramic, where thermal protection is required.

FIG. 2 illustrates a cross-sectional view of a portion of a device having a thermal barrier coating, TBC 16, which is less susceptible to a reduction of strain compliance due to sintering. Preferably the TBC 16 will be at least 50 micrometers thick, to allow superior insulating and protective properties for the underlying substrate. The device 10 has a substrate 12 that may be made of a superalloy metal or other material having the desired mechanical and chemical properties.

Disposed on the substrate 12 is an optional bond coat layer 14. In some applications the bond coat layer 14 may be integral with the substrate 12. In combustion turbine applications the bond coat layer 14 may typically be an MCrAly layer deposited by an EB-PVD, sputtering or low pressure plasma spray process. As is known in the art, the M in this formulation may represent iron, nickel or cobalt, or a mixture thereof. Alternatively, the bond coat layer 14 may be alumina, platinum or platinum aluminide, or there may be no distinct bond coat layer. Disposed on the bond coat layer, or directly on the substrate 12 in the absence of a bond coat layer 14, is a ceramic layer 16 which serves to thermally insulate the substrate 12 form the hostile environment in which it operates. The ceramic layer 16 is preferably formed of a YSZ material, for example 8 weight % yttria stabilized zirconia as is known in the art, or other TBC material, deposited by a new and improved APS process, to form a columnar microstructure characterized by a plurality of gaps 18 between adjacent columns 20 of YSZ or other material. An oxide scale 15 is also shown, being formed from the bond layer 14, and which further protects the substrate from oxidative attack. As shown, the columns 20 provide a columnar structure extending from the outer surface 23 distance 25 which is at least about ⅓ of the thickness toward the substrate 12.

Figure 3:
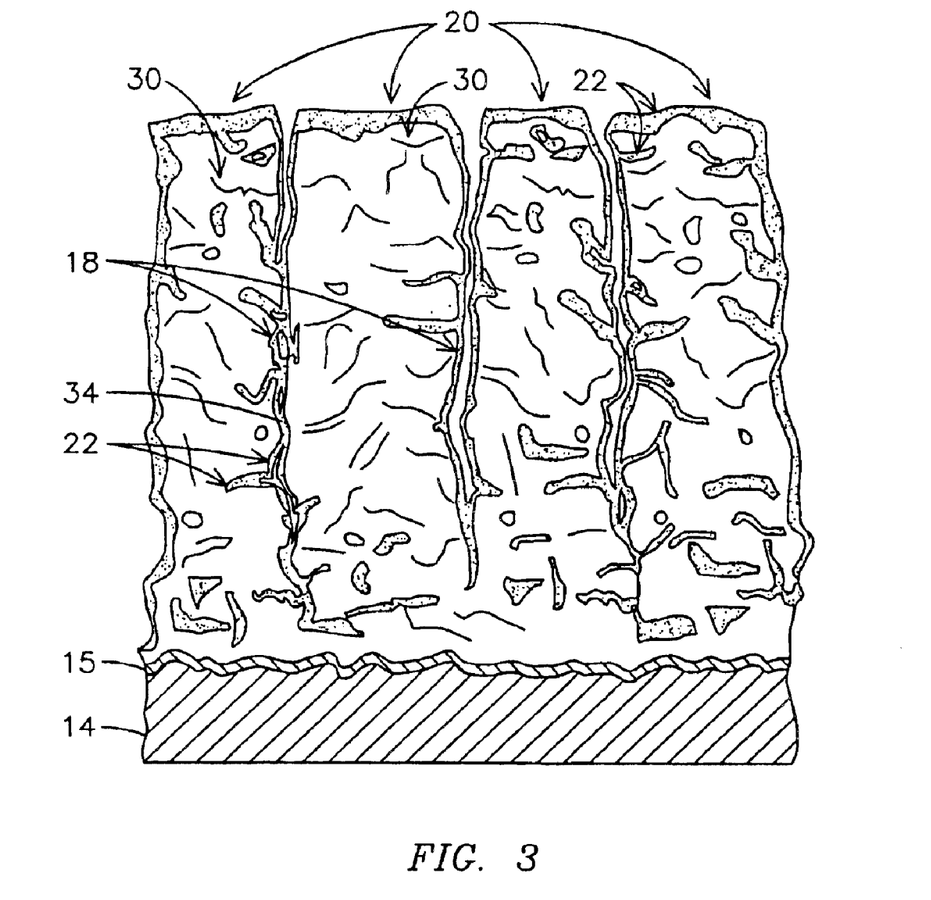
FIG. 3 is a greatly enlarged view of the surface of the thermal barrier coating.

As shown in FIG. 3, the TBC layer of the device also includes a sintering inhibiting material coating 22 disposed within the predominantly vertical gaps 18, but not generally bridging across the gaps from one column to the adjacent column. This sintering inhibiting material 22 will also coat the generally horizontal gaps 30. By sintering resistant material in this application it is meant any material which is more resistive to sintering than the TBC material 12. The sintering inhibiting material 22 may be a ceramic material that is stable over the range of temperature in which the device 10 is operated, for example ambient air temperature to over 1200° C., and as high as 1500° C. By stable in this application it is meant that the material does not undergo a crystallographic phase transformation when exposed to the full range of its design operating temperatures.

U.S. Pat. No. 5,562,998 (Strangman) discussed previously teaches the application of a bond inhibitor coating over a ceramic thermal barrier coating. The bond inhibitor described in that patent is an unstabilized material, such as unstabilized zirconia or unstabilized hafnia. These materials will sinter or bond together during high temperature operation, but upon cooling to lower or ambient temperatures, these materials will cycle through a disruptive tetragonal monoclinic phase transformation. This transformation tends to break the bonds between adjacent columns. While such materials may be effective for aircraft engines that have short thermal cycles, they may be unsuitable for land based power generating engines which have longer operating cycles. During long term exposure to high temperatures, unstabilized zirconia and hafnia will dissolve into the underlying YSZ material.

Once dissolved into the ceramic insulating material, the bond inhibitor material of the U.S. Pat. No. 5,562,998 patent is no longer available to undergo a crystallographic transformation within the gaps upon cooling. Thus, after extended periods of high temperature operation, the sintered bonds are not broken, consequently reducing the strain compliance of the ceramic insulating material and leading to premature failure of the component.

Furthermore, prior art U.S. Pat. No. 5,683,825 (Bruce et al.), discussed above, discloses an erosion resistant thermal barrier coating. In that patent, an erosion resistant composition such as alumina or silicon carbide is disposed on top of a ceramic insulating layer. That patent describes a relatively thick coating of erosion resistant material that does not penetrate between the columns of the underlying ceramic insulating material, and therefore does not act to prevent sintering between the columns.

The sintering inhibiting material 22 of the present invention overcomes these deficiencies in the prior art. By infiltrating a sintering inhibiting material 22 into the gaps 18 and 30 and preventing the bonding of adjacent columns 20, there is no need to rely upon a crystallographic transformation to break the bonds as in the prior art. Sintering inhibiting material 22 is preferably an oxide compound which is insoluble with the underlying ceramic layer 16, and which is stable over the range of temperatures of operation of device 10. One such sintering inhibiting material 22 for use with a ceramic layer 16 of YSZ is aluminum oxide (alumina) $Al_2O_3$. An alternative embodiment for the sintering inhibiting material 22 is yttrium aluminum oxide.

The sintering inhibiting material 22 may be infiltrated into the gaps 18 via a metal organic chemical vapor deposition (CVD) process. The CVD process is used to deposit the sintering resistant material 22 to a thickness on the top surface 23 of the columns 20 of ceramic layer 16 of YSZ is aluminum oxide (alumina) $Al_2O_3$. The sintering inhibiting material 22 may be infiltrated into the gaps 18 via a metal organic chemical vapor deposition (CVD) process. The CVD process is used to deposit the sintering resistant material 22 to a thickness on the top surface of the columns 20 of ceramic layer 16 ranging from no more than a few angstroms to several micrometers. In one embodiment an alumina layer having a thickness of approximately 5 micrometers on the top surface of the columns 20 of the ceramic layer 16 may be used. Alternative embodiments may have a thickness of sintering resistant material on the top surface of the columns 20 of ceramic layer 16 of no more than 0.1 micrometer, or alternatively no more than one micrometer, or alternatively no more than 10 micrometers. The thickness of the coating of sintering resistant material 22 within the gaps 18 will be less than but generally proportional to the thickness on the surface of the ceramic layer 16. The thickness should be controlled to prevent the sintering resistant material 22 from bridging across the gaps 18, such as shown at 15 points 34 thereby degrading the performance of the coating. Because the selected sintering inhibiting material 22 does not readily sinter, the columns 20 of device 10 will not bond at high temperatures. And because the sintering inhibiting material 22 is not soluble with the underlying material of ceramic layer 16, it is maintained at the surface of the columns 20 throughout the life of the device 10, thus maintaining its resistance to sintering.

The sintering inhibiting material 22 may be applied to the insulating ceramic layer 16 as an intermediate amorphous or unstable phase. In one embodiment of the invention, amorphous alumina is deposited within the gaps 18 by a metal organic CVD process. Upon heating, either during the manufacturing process or during the initial operation of the device 10, the amorphous coating undergoes a transformation to a crystallographically stable phase, such as alpha $Al_2O_3$. It is alpha phase that is stable at high temperatures and that performs the function of a sintering inhibitor.

The method for producing a device according to this invention utilizes processes that are commercially available. To produce such a device, a substrate 12 may, optionally, first be coated with a bond coat 14, or directly onto the substrate if no bond coat is used, by a known process such as a low pressure plasma spray, high velocity oxygen fuel, shrouded plasma spray or air plasma spray process. The ceramic TBC layer 16 is then disposed on the bond coat 14 by known improved APS processes which simultaneously utilizes a plasma to melt the ceramic particles of a carrier gas and to deposit the particles onto the substrate. Several modifications to the spray parameters-such as voltage, current, particle velocity and substrate temperature-can control the function of horizontal and vertical cracks.

This improved APS process provides a ceramic TBC layer 16 having a plurality of gaps 18 and 30 therewithin. The sintering inhibiting material 22 is then applied to the surface of the columns 20 by a vapor deposition technique such as chemical vapor deposition or metal organic CVD, or by one of a number of known infiltration techniques such as sol-gel infiltration.

Preferably, the sintering inhibiting material 22 may be applied as a continuous coating within the gaps 18, either as an amorphous or a stable phase. FIG. 2 illustrates an alternative embodiment of a device in accordance with this invention. Like structures are numbered consistently between the two Figures. As seen in FIG. 2, a substrate 12 having an optional bond coat 14 disposed thereon is coated with a ceramic layer 16.

Figure 8:
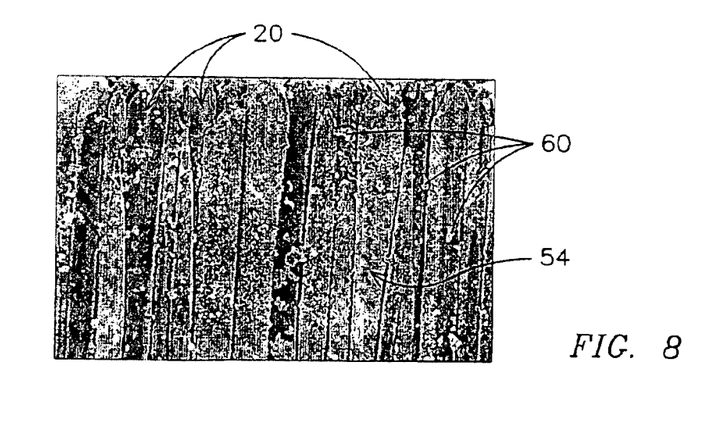
FIG. 8 is a microscopic view of the surface of the thermal barrier coating with a nodule morphology.
Figure 9A:
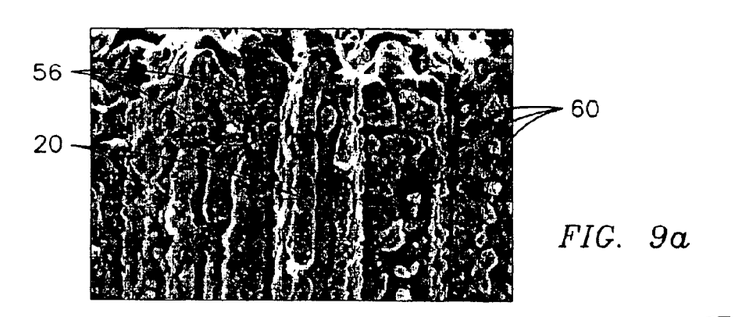
FIGS. 9a, 9b, 9c and 9d are a microscopic view of the surface of the thermal barrier coating with a crack and nodule morphology.
Figure 9B:
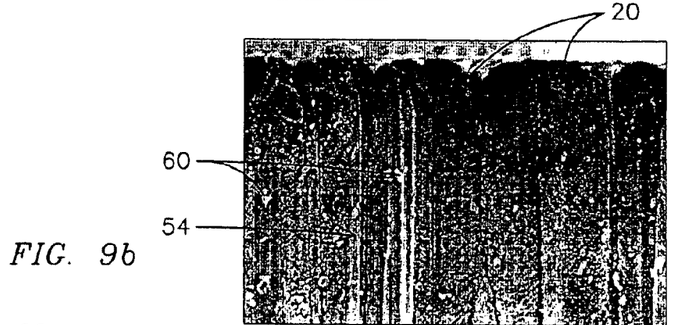
Figure 9C:
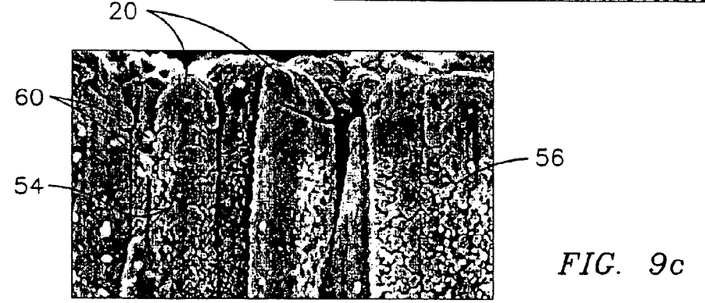
Figure 9D:
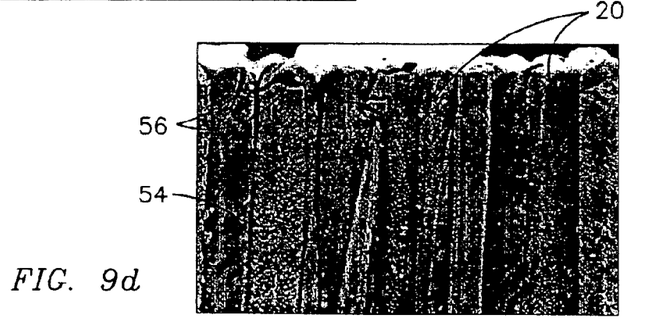

As shown in FIG. 8, the inhibiting material can also be disposed within the gaps 18 as a plurality of nodules which may demonstrate a reduced tendency to form bridges between column 20 due to a lesser contact area between nodules on adjacent columns when compared to a continuous coating of sintering inhibiting material. However, any formation of intermittent bridges between columns 18 can break easily upon regular thermal cycling of device 10. The nodular morphology is achieved by controlling the thickness of the applied coating of material and the subsequent heat treatment. For example, a relatively thin coating of approximately 0.1 micrometer of alumina at the top surface 23 of the ceramic layer 16 will result in a relatively thin continuous layer in the gaps 18.

During the subsequent heat treatment, as the alumina converts to the stable alpha phase it undergoes a volume reduction which tends to create nodules of sintering resistant material within the gaps. A thicker coating of approximately 1 micrometer of alumina at the surface will provide a thick enough coating within the gaps 18 that even after heat treatment the sintering resistant material 22 to remain as a continuous coating. An alternative method of achieving a continuous coating within the gaps 18 is to apply multiple thin layers of the sintering resistant material so that any space is essentially filled with to create a continuous coating 22.

In the embodiment of FIG. 3, the sintering inhibiting material is disposed within only a top portion of gaps 18 and not a bottom portion of gaps 18. The geometry of the gaps 18 and the process for depositing the coating will control this variable. Preferably in this process the improved APS process will cause the sintering inhibiting material to coat the interior gaps 18 and 30 to a substantial extent, at least ⅟₁₀ the thickness of the thermal barrier layer 16.

In accordance with another concept of the present invention, and referring now to FIGS. 3–9, the sintering inhibiting material 20 is formed and arranged to have certain morphologies. Like with the above-described concepts and embodiments, the sintering inhibiting material 20 is infiltrated into the vertical and horizontal gaps 18, 30 in the columns 20 of the underlying ceramic thermal barrier coating layer 16. Thus, the above description of like components, materials, and methods thus should be understood as applying equally to the below embodiments, unless stated otherwise.

An optional bond coat 14 is coated, applied, disposed, or otherwise arranged onto at least a portion of the substrate 12 as described above and as understood by those skilled in the art. A ceramic thermal barrier coating layer 16 is then coated, applied, disposed, or otherwise arranged onto at least a portion of the bond coat 14 or directly onto the substrate 12 as described above and/or understood by those skilled in the art to form the columns 20 having vertical and horizontal cracks 18, 30. The sintering inhibiting material 22 is then coated, applied, disposed, or otherwise arranged onto at least a portion of the columns 20 such that the sintering inhibiting material 22 can infiltrate into at least some of the gaps 18, 30 as explained above and as understood by those skilled in the art.

It has been discovered that when the sintering inhibiting material 22 is arranged in certain morphologies, certain functionality of the sintering inhibiting material 22 can be improved. These morphologies can be created or attained by modifying the application temperature, application speed, application distance, application time and the like when arranging the sintering inhibiting material 22 onto the columns 20 for infiltration into the gaps 18, 30, as will be understood by those skilled in the art.

Figure 4A:
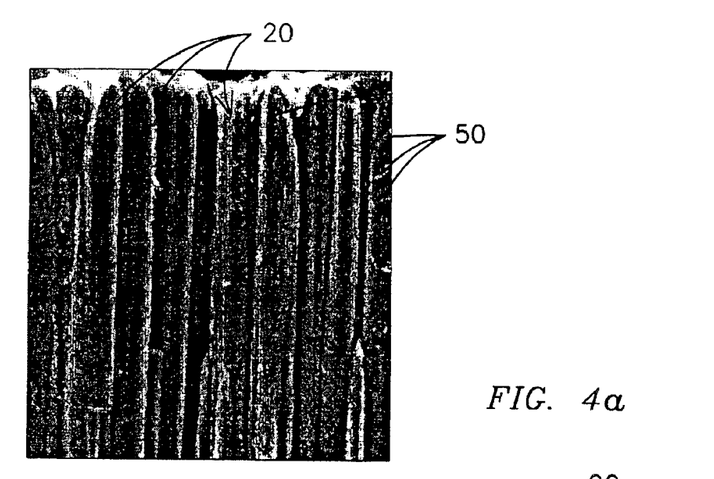
FIGS. 4a, 4b and 4c are a microscopic view of the surface of the thermal barrier coating with a rivulet morphology.
Figure 4B:
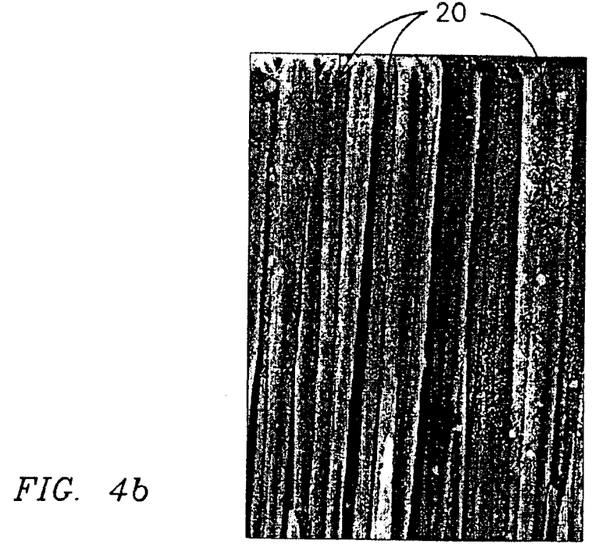
Figure 4C:
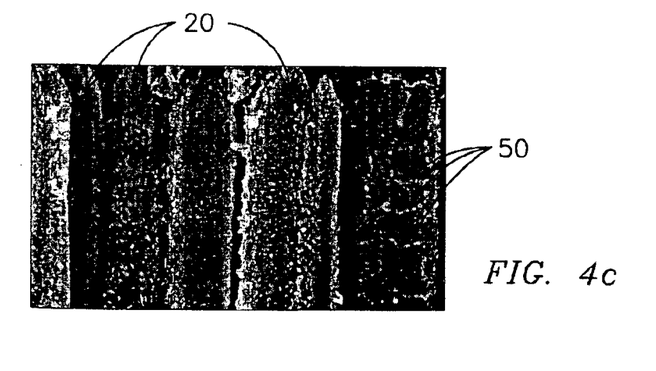

Referring to FIGS. 4a, 4b and 4c, one improved morphology comprises a rivulet 50. A rivulet 50 can be characterized as a generally vertically extending stream. The rivulet 50 advantageously has a vertical length ranging from about 0.1 micrometer to about the entire length of the column 20 and even spilling onto the base of the column, a width ranging from about 0.01 micrometer to about one-half the width of the column 20, and a thickness of about 0.1 micrometer to about that of the gap 18 or 30. These dimensions, however, can extend beyond the above advantageous ranges depending upon the particular application of the sintering inhibitor 22 and column 20.

An advantage of this rivulet 50 morphology is that it tends to be relatively easy to deposit onto the ceramic layer 16. Another advantage is that the rivulets 50 can form to relatively great depths. Another advantage is that rivulets 50 tend to be more cost effective to from since there is a lesser requirement of the infiltrant than required for a continuous film.

Figure 5A:
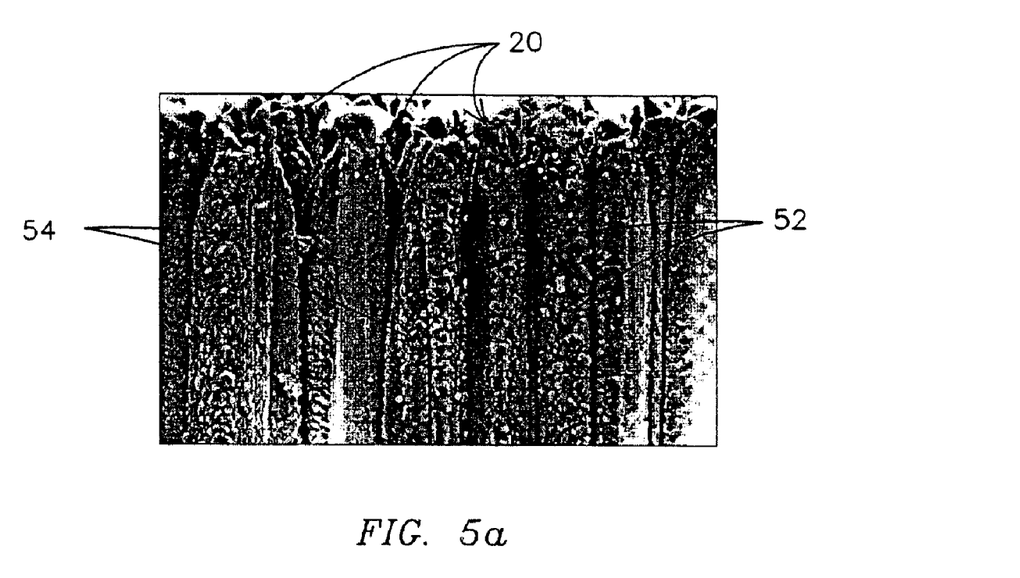
FIGS. 5a and 5b are a microscopic view of the surface of the thermal barrier coating with a grain morphology.
Figure 5B:
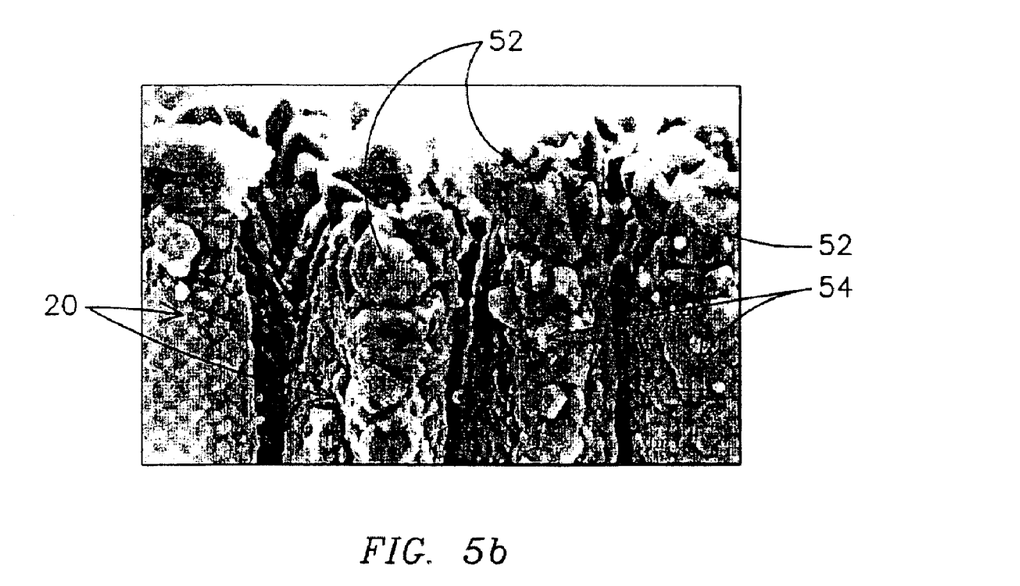

Referring to FIGS. 5a and 5b, another improved morphology comprises a grain 52; advantageously formed into a film 54. A grain 52 can be characterized as having a volume ranging from about 1 cubic micrometer to about 100 cubic micrometers. This dimension, however, can extend beyond the above advantageous range depending upon the particular application of the sintering inhibitor 22 and column 20. The film 54 advantageously comprises a plurality of grains 52, with most grains 52 advantageously in contact with at least one other grain 52. The film 54 has a continuous or discontinuous thickness of about 0.1 micrometer to about that of the gap 18, and is formed on at least a portion of the columns 20 or gaps 18, 30.

An advantage of this grain 52 morphology is that it tends to be relatively easy to deposit onto the ceramic layer 16. Another advantage is that grains 52 tend to be more cost effective to form due to the ease of formation of polycrysatalline coatings relative to continuous single crystalline columns.

Figure 6A:
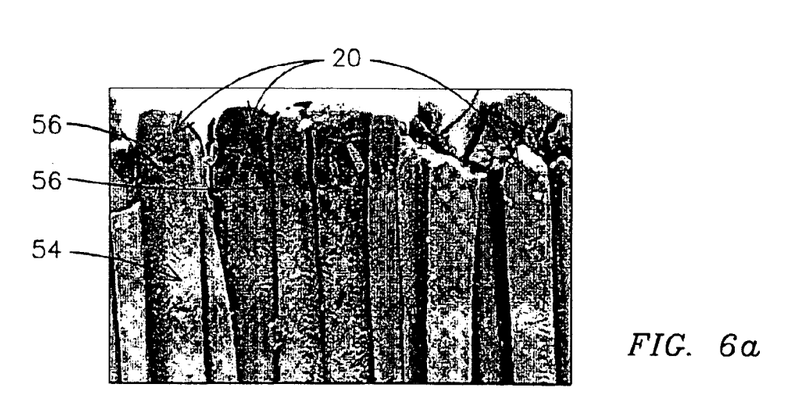
FIGS. 6a, 6b and 6c are a microscopic view of the surface of the thermal barrier coating with a crack morphology.
Figure 6B:
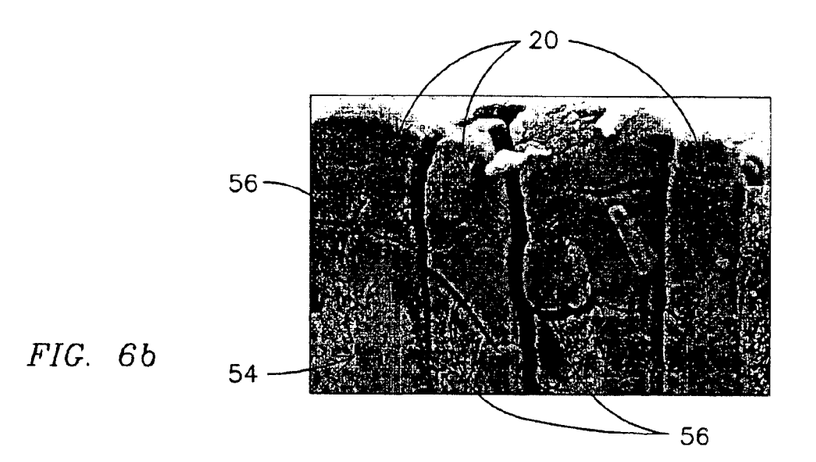
Figure 6C:
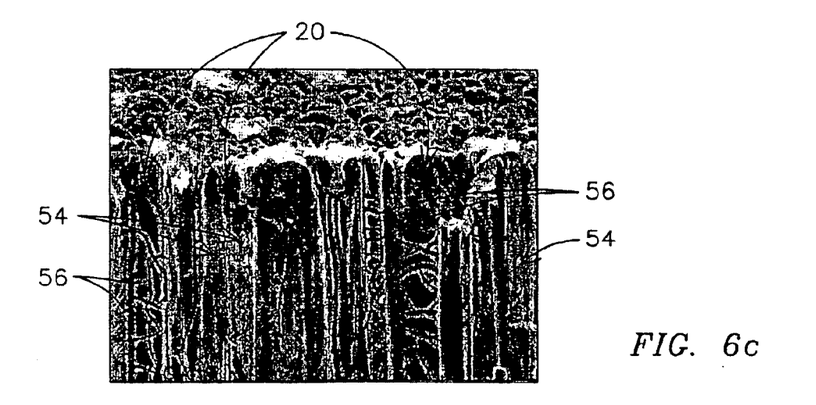

Referring to FIGS. 6a, 6b and 6c, another improved morphology comprises a crack 56; advantageously formed into a film 54. A crack 56 can be characterized as having a length that is greater than its width, extending along at least a portion of the film 54, and at least partially entering into the film 54 thickness. These dimensions, however, can extend beyond the above advantageous range depending upon the particular application of the sintering inhibitor 22 and column 20. The film 54 advantageously comprises a plurality of cracks 56. The film 54 has a continuous or discontinuous thickness of about 0.1 micrometer to about that of the gap 18, and is formed on at least a portion of the columns 20 or gaps 18, 30.

An advantage of this crack 56 morphology is that it tends to be relatively easy to deposit onto the ceramic layer 16. Another advantage is that cracks 56 tend to be more cost effective to form since processing of cracked coatings are easier than processing of continuous uncracked coatings.

Figure 7A:
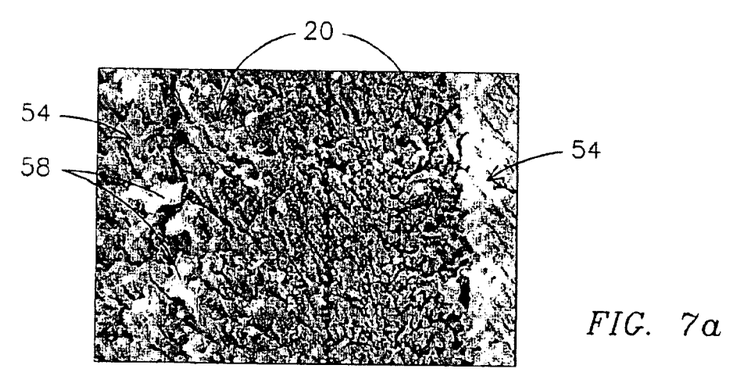
FIGS. 7a and 7b are a microscopic view of the surface of the thermal barrier coating with a flake morphology.
Figure 7B:
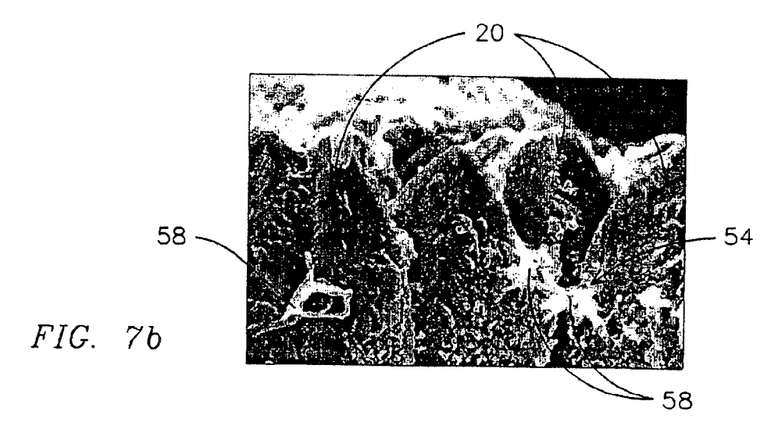

Referring to FIGS. 7a and 7b, another improved morphology comprises a flake 58; advantageously formed onto a film 54. A flake 58 can be characterized as having a surface area ranging from about 0.1 square micrometer to about 10 square micrometers, and a thickness that is less than its length and width. These dimensions, however, can extend beyond the above advantageous range depending upon the particular application of the sintering inhibitor 22 and column 20. The film 54 advantageously comprises a plurality of flakes 58, with most flakes 58 advantageously in contact or near contact with at least one other flakes 58 (near contact being within a flake distance away). The film 54 has a continuous or discontinuous thickness of about 0.1 micrometer to about that of the gap 18, and is formed on at least a portion of the columns 20 or gaps 18, 30.

An advantage of this flake 58 morphology is that it tends to be relatively easy to deposit onto the ceramic layer 16. Another advantage is that flakes 58 tend to be more cost effective to from since there is a lesser requirement of the infiltrant than required for a continuous film.

Referring to FIGS. 9a, 9b, 9c and 9d, another improved morphology comprises a combination of one or more of the above-described sintering inhibiting material 22 morphologies. For example, a cracked 56 film 54 morphology combined with a nodule 60 morphology is shown. It is thus understood that the various morphologies can be mixed and matched with each other to provide additional morphologies. It is also understood that certain functionality of the sintering inhibiting material 22 can be improved by use of other morphologies not disclosed herein, but within the spirit and scope of this invention.

Although this invention has been described in terms of a certain exemplary uses, preferred embodiment, and possible modifications thereto, other uses, embodiments and possible modifications apparent to those of ordinary skill in the art are also within the spirit and scope of this invention. It is also understood that various aspects of one or more features of this invention can be used or interchanged with various aspects of one or more other features of this invention. Accordingly, the scope of the invention is intended to be defined only by the claims that follow. Other aspects, objects and advantages of this invention may be obtained by studying the Figures, the disclosure, and the appended claims.

What is claimed is:

1. A device adapted for use in a high temperature environment in excess of about 1000° C., comprising:
   a substrate having a surface;
   a ceramic layer disposed on the substrate surface in a manner that provides the ceramic layer with a microstructure characterized by a plurality of vertical and horizontal gaps; and
   a sintering inhibiting material having a morphology selected from the group consisting of rivulet, grain, cracked film, flake, nodule and combinations thereof disposed within at least some of the vertical and horizontal gaps.

2. The device of claim 1, wherein a bond coat layer is disposed between the substrate and the ceramic layer.

3. The device of claim 1, wherein the sintering inhibiting material has a rivulet morphology, with at least one rivulet having a vertical length ranging from about 0.1 micrometer to about the entire length of the vertical gap, a width ranging from about 0.01 micrometer to about one-half the width of the vertical gap, and a thickness of about 0.1 micrometer to about that of the gaps.

4. The device of claim 1, wherein the sintering inhibiting material has a grain morphology, with at least one grain having a volume ranging from about 1 cubic micrometer to about 100 cubic micrometers, and a plurality of the grains forming a film with most grains in contact with at least one other grain, the film having a thickness of about 0.1 micrometer to about that of the gaps.

5. The device of claim 1, wherein the sintering inhibiting material has a cracked film morphology, with at least one crack having a length that is greater than its width extending along at least a portion of the film and at least partially entering into the film thickness, and the film having a thickness of about 0.1 micrometer to about that of the gaps.

6. The device of claim 1, wherein the sintering inhibiting material has a flake morphology, with at least one flake having a surface area ranging from about 0.1 square micrometer to about 10 square micrometers and a thickness that is less than its length and width, and a plurality of flakes forming a film with most flakes in contact or near contact with at least one other flake, the film having a thickness of about 0.1 micrometer to about that of the gaps.

7. The device of claim 1, wherein the sintering inhibiting material has a morphology selected from two or more of the group consisting of rivulet, grain, cracked film, nodule and flake.

8. The device of claim 1, wherein the sintering inhibiting material forms a film over the vertical and horizontal gaps.

9. The device of claim 1, wherein the ceramic layer is deposited onto the substrate surface by a deposition method selected from the group consisting of chemical vapor deposition, physical vapor deposition, and air plasma spraying.

10. The device of claim 1, wherein the ceramic layer has a microstructure characterized by a columnar structure formed by the vertical gaps, and with the horizontal gaps formed in the columnar structure.

11. The device of claim 1, wherein the sintering inhibiting material is stable over a range of temperature from room temperature to the high temperature environment.

12. The device of claim 1, wherein the sintering inhibiting material is disposed onto the substrate surface in an unstable phase and subsequently heat treated to obtain a sintering inhibiting material which is stable over a temperature range.

13. The device of claim 12, wherein the heat treatment is performed during operation of the device.

14. The device of claim 1, wherein the device is a component of a combustion turbine.

15. A thermal barrier coating adapted to at least partially coat a substrate for use in a high temperature environment in excess of about 1000° C., comprising:
   a ceramic layer disposed on a substrate surface in a manner that provides the ceramic layer with a microstructure characterized by a plurality of vertical and horizontal gaps; and
   a sintering inhibiting material having a morphology selected from the group consisting of rivulet, grain, cracked film, flake, nodule and combinations thereof disposed within at least some of the vertical and horizontal gaps.

16. The device of claim 15, wherein a bond coat layer is disposed between the substrate and the ceramic layer.

17. The device of claim 15, wherein the sintering inhibiting material has a morphology selected from two or more of the group consisting of rivulet, grain, cracked film and flake.

18. The device of claim 15, wherein the sintering inhibiting material forms a film over the vertical and horizontal gaps.

19. The device of claim 15, wherein the ceramic layer is deposited onto the substrate surface by a deposition method selected from the group consisting of chemical vapor deposition, physical vapor deposition, and air plasma spraying.

20. A combustion turbine blade adapted to withstand temperature in excess of about 1000° C. for prolonged periods of time, comprising:
   a superalloy substrate;
   a ceramic layer disposed on the substrate surface in a manner that provides the ceramic layer with a microstructure characterized by a plurality of vertical and horizontal gaps; and
   a sintering inhibiting material having a morphology selected from the group consisting of rivulet, grain, cracked film, flake, nodule and combinations thereof disposed within at least some of the vertical and horizontal gaps.

* * * * *